United States Patent Office 3,241,973
Patented Mar. 22, 1966

3,241,973
PHOTOPOLYMERIZABLE ELEMENT AND PROCESS FOR PREPARING SAME

Glen Anthony Thommes, Middletown, N.J., assignor to E. I. du Pont de Nemours and Company, Wilmington, Del., a corporation of Delaware No Drawing. Filed Oct. 16, 1961, Ser. No. 145,447
14 Claims. (Cl. 96—115)

This invention relates to an improved process for preparing addition polymerizable elements. More particularly it relates to such a process wherein a photopolymerizable adhesive is utilized to bond an addition polymerizable layer to a base support. This invention also relates to elements having a photopolymerizable adhesive layer.

Photopolymerizable elements useful for making printing reliefs are described in Plambeck U.S. Patent 2,791,504. These elements comprise a suitable support having superposed thereon a photopolymerizable layer or stratum comprising a polymeric binder, an addition polymerization initiator activatable by actinic radiation, and an addition polymerizable ethylenically unsaturated compound capable of forming a high polymer by photoinitiated addition polymerization in the presence of such an initiator. These elements usually contain antihalation material which is generally in a layer or stratum beneath the relief-forming portion of the photopolymerizable layer.

To provide for adherence of the photopolymerizable layer to the base a suitable adhesive or anchor layer is placed between the two surfaces to be bonded. It is important that the adhesive layer be capable of binding the photopolymerizable layer to the base support with great strength and yet not interfere in any manner with the photopolymerization and processing of the element during its preferred usage, the preparation of a relief image printing plate.

To prepare a printing plate a photopolymerizable element, such as described above, is exposed to a source of actinic radiation, through, for example, a photographic negative, to form a hardened image in the areas of the photopolymerizable layer exposed to the radiation. The unexposed areas of the layer are then removed by washing or spraying with a solvent for the polymeric binder. It has been found, however, that during the removal operation, the washout solution is able to attack the adhesive layer thereby weakening the bond between the relief image and the base support. The weakening of the bond occurs particularly in the areas where the unexposed photopolymerizable material is removed.

Another deficiency of prior art adhesive layers is that some of the relief image characters of the photopolymerized printing elements can be easily pushed over and separated from the base support during normal press operations. It has been found that this is due to the small area of some characters in contact with the adhesive layer and to the type of adhesive utilized.

The photopolymerizable elements disclosed in assignee's Burg U.S. application Serial No. 750,868, filed July 25, 1958, now Patent No. 3,036,913 are a distinct improvement over the elements of the prior art. The adhesive layer described therein comprises a polyester or copolyester and a thermally sensitive addition polymerization initiator. After placing the adhesive between the photopolymerizable layer and the base support, the photopolymerizable layer is laminated to the support by applying heat and pressure whereby a very thin layer of the photopolymerizable layer adjacent to the adhesive layer is thermally polymerized. Thus, a strong bond is formed between the photopolymerizable layer and the adhesive layer while the thin, polymerized layer forms a protective or barrier layer which protects the adhesive from solvent attack during the wash-out operation of the exposed photopolymerizable layer.

The above-described process relies on a thermal polymerization step to provide the protective barrier layer. The photoinitiators in the photopolymerizable layer must be thermally stable at least up to the temperature at which the thermal initiator in the anchor layer is active. This condition restricts the number of photoinitiators applicable in such a system. Furthermore, the heating step complicates the process of making photopolymerizable elements in those instances where the photopolymerizable layer is not laminated at elevated temperatures to the support but is applied by other methods, e.g., by solvent casting and extruding.

It is therefore an object of this invention to provide an improved process for preparing photopolymerizable elements having outstanding adhesion characteristics between layers. Another object is to provide a process that overcomes the above-described shortcomings of the prior art. A further object is to provide such a process which is readily adaptable to a continuous operation. A specific object is to provide a process for preparing a photopolymerizable element having an adhesive layer composed of an improved adhesive composition. Yet another object is to provide an improved photopolymerizable element. Still further objects will be apparent from the following description.

This invention, in its broader aspects, comprises a process wherein a photopolymerizable element comprising a support (I), a solid photopolymerizable stratum (II) comprising a preformed compatible macromolecular polymer binding agent, a non-gaseous, addition-polymerizable ethylenically unsaturated compound containing at least one terminal ethylenic group, having a molecular weight of less than 1500, a boiling point above 100° C. at normal atmospheric pressure and being capable of forming a high polymer by free-radical initiated, chain-propagating addition polymerization in the presence of an addition polymerization initiator therefor activatable by actinic radiation, and from 0.001 to 10 percent or more, by weight of the stratum, of such an initiator, said initiator being thermally inactive at 85° C., and in surface contact with at least the photopolymerizable stratum a layer (III) of an adhesive composition comprising (A) at least 66.5 parts by weight of a macromolecular linear polyester composition selected from the group consisting of (1) a polyester prepared by reacting (a) a compound taken from the group consisting of hexahydroterephthalic acid and an ester-forming derivative of hexahydroterephthalic acid and (b) a glycol having from 2 to 10 carbon atoms and 0 to 4 oxygen atoms in addition to the hydroxyl groups; (2) at least one copolyester prepared by reacting (a) at least one saturated aliphatic compound taken from the group consisting of adipic, pimelic, suberic, azelaic and sebacic acids and an ester-forming derivative of said acids, the total of the said compounds being in an amount of 50 mole percent of said copolyester, (b) at least one aromatic compound taken from the group consisting of terephthalic acid, isophthalic acid and an ester-forming derivative of said acids, the total of the said compounds being in an amount of 50 mole percent of said copolyester and (c) a glycol having from 2 to 10 carbon atoms and 0 to 4 oxygen atoms in addition to the hydroxyl groups; and (3) a copolyester prepared by reacting (a) a compound taken from the group consisting of hexahydroterephthalic acid and an ester-forming derivative of said acid in an amount up to 100 mole percent of the copolyester, (b) a saturated aliphatic compound taken from the group consisting of adipic, pimelic, suberic, azelaic and sebacic acids and an ester-forming derivative of said acids, in an amount up to 50 mole percent of the copolyester, (c) an aromatic compound taken from the group consisting of terephthalic, isophthalic acids and an ester-forming derivative of said acids, in an amount up to 50 mole percent of the copolyester and (d) a glycol having from 2 to 10 carbon atoms and 0 to 4 oxygen atoms in addition to the hydroxyl groups; (B) up to 33.5 parts by weight of an ethylenically unsaturated addition polymerizable compound; (C) 0 to 0.67 parts by weight of a thermal polymerization inhibitor; and (D) from 0.5 to 5.0 parts by weight of an addition polymerization photoinitiator essentially thermally inactive below about 80° C. and activatable by actinic radiation, said element, including said adhesive layer, being uniformly exposed to actinic radiation in an amount sufficient to photopolymerize the adhesive layer but in an amount insufficient to initiate photopolymerization in said photopolymerizable layer, said photopolymerizable element being characterized by having an induction period in the most sensitive region of the photopolymerizable stratum at least 10 percent greater, and preferably at least 20 percent greater, than the induction period in the least sensitive region of the adhesive layer. The induction period is defined as the period of time elapsed from the start of the exposure to the point where the first traces of solvent-insoluble, high polymer are formed.

By way of illustration, in order to meet the above criterion, (a) The photoinitiator in the adhesive layer may have an absorption per unit layer thickness in the actinic radiation range at least 1.5 times as great as the initiator in the photopolymerizable layer;

(b) The absorption of actinic radiation per unit layer thickness in the photopolymerizable layer may be greater than in the adhesive layer, but the adhesive layer is more sensitive (shorter induction period) by virtue of an initiator or initiator environment which leads to higher quantum efficiency;

(c) The absorption per unit layer thickness may be greater in the photopolymerizable layer, but the induction period in the adhesive layer is shorter because of lower inhibitor concentration in the adhesive layer.

The difference in the absorption per unit layer thickness in the actinic radiation exposure range can be attained, for example, by adjusting the initiator concentrations in the adhesive and polymerizable layers, or preferably by selecting an adhesive composition-initiator system having a spectral sensitivity different from that of the photopolymerizable composition-initiator system. Suitable initiators useful in the layers include phenanthrenequinone, anthraquinone, ethylanthraquinone, uranyl nitrate, etc. The photoinitiator in the adhesive composition must be thermally stable at any temperature to which the adhesive composition is exposed prior to or during manufacture of the photopolymerizable element.

The invention is not limited to the above-described systems as other methods for varying the induction period in the adhesive and photopolymerizable layers can be devised from this specification.

The radiation used to polymerize the adhesive layer is preferably of such a spectral distribution that the above-mentioned absorption conditions are fulfilled. This can be accomplished by a suitable radiation source-filter combination. Preferably the spectral sensitivity of the adhesive layer extends further toward long wave radiation than that of the image layer. Therefore, suitable filters are those which transmit essentially no radiation below a certain critical wavelength, i.e., sharp cut-off and narrow band filters such as Corning 1–57, 1–58, 1–59, 1–62, 0–52, 0–51, 5–59, 5–60, 4–72, 4–71, 4–70, 4–76, 7–83, etc., and filters of similar characteristics made by other manufacturers. Any radiation source that emits strongly within the spectral sensitivity range of the adhesive composition-initiator system can be used, e.g., carbon arcs, fluorescent tubes, gas discharge tubes, certain incandescent lights, etc. Exposure sources without filters can be used in systems of the type described in (b) and (c) above.

It is necessary that the photopolymerizable layer (II) be in contact with the adhesive layer (III), but it is not essential that the adhesive layer be in surface contact with the support (I). For example, the sheet support can bear thereon a surface coating or layer of an antihalation material, which can be in a suitable binder, and this coating in turn may carry the anchor layer. In alternative structures, the antihalation material can be admixed in the adhesive composition used to adhere the support to the photopolymerizable layer with effective results or can be present in the photopolymerizable layer.

The antihalation material should be sufficiently absorptive of actinic radiation so as to permit reflectance from the support or combined support of no more than 35% of incident actinic radiation. Suitable materials are disclosed in the patents and applications referred to below.

This invention also relates to novel photopolymerizable elements useful in the above-described process, said elements comprising a support (I); a solid photopolymerizable stratum (II) comprising a preformed, compatible macromolecular polymer binding agent, a non-gaseous addition-polymerizable ethylenically unsaturated compound containing at least one terminal ethylenic group, having a molecular weight of less than 1500, a boiling point above 100° C. at normal atmospheric pressure and being capable of forming a high polymer by free-radical initiated, chain-propagating addition polymerization in the presence of an addition polymerization initiator therefor activatable by actinic radiation, and from 0.001 to 10 percent or more, by weight of the stratum, of such an initiator, said initiator being thermally inactive at 85° C., and in surface contact with at least the photopolymerizable stratum a layer (III) of an adhesive composition comprising (A) at least 66.5 parts by weight of a macromolecular linear polyester or copolyester as described above; (B) up to 33.5 parts by weight of an ethylenically unsaturated addition polymerizable compound; (C) 0 to 0.67 part by weight of a thermal polymerization inhibitor; and (D) 0.5 to 5.0 parts by weight of an addition polymerization photoinitiator essentially thermally inactive below about 80° C. and activatable by actinic radiation, said photopolymerizable element being characterized by having an induction period in the most sensitive region of the photopolymerizable stratum at least 10% greater, and preferably at least 20% greater, than the induction period in the least sensitive region of the adhesive layer. Upon photopolymerization of the adhesive layer the photopolymerizable element comprises a support, a solid photopolymerizable stratum, as described above, and in surface contact with at least the photopolymerizable stratum a photopolymerized adhesive layer. The photopolymerizable stratum, in general, contains 40 to 90 parts by weight of polymeric binding agent and 10 to 60 parts by weight of the ethylenically unsaturated compound.

In an exemplary procedure for preparing a photopolymerizable element, an adhesive composition of the type described above containing a photoinitiator, e.g., in a solvent such as methylethyl ketone, is applied to a base support, e.g., a steel plate; the adhesive solution is dried and a sheet of a photopolymerizable composition to be hereinafter described is laminated to the adhesive-bearing support. In the lamination, the element formed is passed between combining rollers at a temperature below the sensitivity temperature of the photoinitiator, e.g., preferably at room temperature. The pressing force of the combining rollers generally ranges from 10 to 1500 pounds per inch across the rollers.

The laminated element is then uniformly exposed to actinic radiation, e.g., through the polymerizable layer or through the support if the base is transparent to actinic radiation, in an amount sufficient to polymerize only the ethylenically unsaturated monomeric compound in the adhesive layer but not to initiate polymerization of the monomeric compound in the photopolymerizable layer. The polymerization of the adhesive layer can be accomplished in a variation of ways, e.g., by using a higher concentration of initiator in the adhesive layer, by using a more reactive initiator in the adhesive layer, by using an initiator sensitive to radiation in different spectral regions than the initiator utilized in the photopolymerizable layer, by using a higher concentration of inhibitor in the photopolymerizable layer than in the adhesive layer, etc. Any combination, including all these variations, can be used.

The optimum initiator concentration in the adhesive layer depends on a number of factors, e.g., the type of initiator used in the adhesive layer, the type of initiator used in the photopolymerizable layer, the types of ethylenically unsaturated monomeric compounds used in the respective layers, the relative thickness of the layers, the degree of transmittance by the photopolymerizable layer of the actinic radiation to which the initiator in the adhesive layer is responsive, the types and amounts of inhibitors used in the two layers, etc. All these factors have to be balanced in such a way that upon exposure to actinic radiation to which the initiator in the adhesive layer is responsive the monomeric compound in the adhesive layer is polymerized before polymerization in the photopolymerizable layer commences.

The adhesive composition can also be applied as a sheet in the absence of a solvent, or it can be laid down with a doctor knife, or if in a solvent solution, by spraying the metal support. The adhesive composition can also be applied to the light-sensitive photopolymerizable layer, rather than to the sheet support, prior to sandwiching the element together.

Subsequent to polymerizing the adhesive layer of the element, the photopolymerizable layer is exposed through an image-bearing transparency, consisting solely of substantially opaque and substantially transparent areas to approximately 10 to 50 watt-seconds of actinic radiation per square inch (depending on the particular photopolymerizable composition used) and the unexposed areas are removed by spraying or washing with a solvent for the unpolymerized material.

A preferred adhesive composition contains (A) about 75 to 80 parts by weight of the copolyester corresponding to the esterification product of ethylene glycol and dimethyl hexahydroterephthalate, dimethyl sebacate and dimethyl terephthalate, the latter three reactants being used in a molar ratio of 8:1:1, respectively, (B) about 15 to 24.5 parts by weight of triethylene glycol diacrylate as the ethylenically unsaturated addition polymerizable compound, containing about 0.1 to 1.0 part by weight of p-methoxyphenol as the polymerization inhibitor and (C) about .05 to 5 parts by weight of phenanthrenequinone as the photosensitive addition polymerization initiator. These components are conveniently admixed in a solvent solution, such as in methylethyl ketone, preferably in an amount of about 311 parts by weight. Other suitable solvents include methylene chloride, chloroform, methyl isopropyl ketone, methyl isobutyl ketone, etc.

The polyester or copolyester that forms one essential component of the adhesive composition can be prepared in accordance with known procedures and techniques, for example, as disclosed in Whinfield et al. U.S. 2,465,-319, Snyder U.S. 2,623,031 and Snyder U.S. 2,623,033, by the alcoholysis with the suitable glycol of the dialkyl (for example, dimethyl) ester or esters of the acid component or components. The reaction is preferably carried out in the presence of one or more esterification catalysts. Suitable catalysts are known in the art. A preferred combination of catalysts includes calcium acetate and antimony trioxide.

The dialkyl hexahydroterephthalate can be conveniently prepared by the hydrogenation of dialkyl terephthalate over Raney nickel.

As disclosed in the Whinfield et al. and Snyder patents referred to above, with reference to the preferred copolyester, the alcoholysis reaction comprises heating the alkyl esters of the respective acids in the liquid state at atmospheric pressure and at a temperature of from 155° C. to 240° C. together with an excess of the dihydric alcohol reactant, and preferably from 1.5 to 3.0 moles of the dihydric alcohol reactant per mole of dialkyl ester, in the presence of the selected catalyst or combination of catalysts. Methanol is liberated during the ester interchange reaction. After the evolution of the methanol is complete, heating of the resulting monomeric bisdihydric alcohol esters is continued in a melt polymerization process under reduced pressure, such as from 0.5 millimeter to 2 millimeters of mercury at an increased temperature, such as from about 240° to about 280° C., with agitation until the resulting copolyester has the desired viscosity.

Illustrative of glycols (having from 2 to 10 carbon atoms and 0 to 4 oxygen atoms in addition to the hydroxyl groups) suitable as a component of the essential copolyester ingredient of the adhesive composition are the following: 1,2-ethanediol, 1,2-propanediol, 1,3-propanediol, 1,2-butanediol, 1,3-butanediol, 1,4-butanediol, 1,2-pentanediol, 2,3-pentanediol, 2,4-pentanediol, 1,5-pentanediol, 1,2-hexanediol, 2,3-hexanediol, 3,4-hexanediol, 1,6-hexanediol, 1,2-heptanediol, 1,2-octanediol, 1,2-nonanediol, 1,2-decanediol, 2-methylpropane-1,3-diol, 2,2-dimethylpropane-1,3-diol, 2,2-diethylpropane-1,3-diol, 2-methoxymethyl-2,4-dimethylpentane-1,5 - diol, 2-ethylhexane-1,3-diol, diethylene glycol, triethylene glycol, dipropylene glycol, tripropylene glycol, tetraethylene glycol, pentaethylene glycol, 1,2-cyclopentanediol, 1,3-cyclopentanediol, 1,2-cyclohexanediol, 1,3-cyclohexanediol, etc.

A wide variety of compounds can be used as the ethylenically unsaturated addition polymerizable compound in the adhesive composition according to this invention. Illustrative of suitable compounds can be named triethylene glycol diacrylates, ethylene glycol dimethacrylate, diethylene glycol diacrylate, a mixture of triethylene glycol diacrylate and acrylamide, triethylene glycol dimethacrylate, diacrylates of polyethylene glycols of molecular weights of about 300 to 500, and esters of alpha-methylene carboxylic acids, e.g., methyl methacrylate. A portion, e.g., up to 25% by weight, of the above-described monomers can be replaced by N-(beta-hydroxyethyl)methacrylamide, N - N - bis(beta-hydroxyethyl) acrylamide, beta-acetoamidoethyl methacrylate and beta-methacrylamidoethyl propionate; olefin blends with ethylenic alpha, beta-dicarboxylic acid or esters thereof, e.g., styrene-diethyl fumarate, styrene-diethyl maleate; esters of vinylbenzoic acid, e.g., methyl vinyl benzoate and beta-hydroxyethyl vinylbenzoate.

Numerous compositions fulfilling the definition for the solid photopolymerizable layer can be used in this invention. Some suitable compositions, in addition to those of Plambeck 2,791,504, are disclosed in the following patents and applications:

(1) The N-methoxymethyl polyhexamethylene adipamide mixtures disclosed by assignee's Saner application Serial No. 577,829, filed April 12, 1956, now abandoned and corresponding British Patent 826,272;

(2) The polyvinyl acetals having extralinear vinylidene groups disclosed in U.S. Patent 2,929,710, March 22, 1960;

(3) The polyester, polyacetal or mixed polyester acetal mixtures disclosed in U.S. Patent 2,892,716, June 30, 1959;

(4) The blends of selected organic-soluble, base-soluble cellulose derivatives with addition-polymerizable components and photoinitiators disclosed in U.S. Patent 2,927,022, March 1, 1960;

(5) The polyvinyl alcohol derivatives disclosed in U.S. Patent 2,902,365, September 1, 1959;

(6) The water-soluble cellulose ether and ester compositions disclosed in U.S. Patent 2,927,023, March 1, 1960;

(7) The water-soluble polyvinyl ether and ester compositions of British Patent 834,337;

(8) The 1,3-butadiene compositions of assignee's McGraw U.S. application Serial No. 664,459, filed June 10, 1957, now abandoned, and U.S. application Serial No. 833,927, filed August 17, 1959, now abandoned;

(9) The linear polyamide compositions containing extralinear N-acrylyloxymethyl groups of U.S. Patent 2,972,540, February 21, 1961.

In addition, a composition comprising cellulose acetate (60% by weight); triethylene glycol diacrylate (40% by weight); anthraquinone, photoinitiator (0.1% by weight based on the photopolymerizable material); and p-methoxyphenol thermal polymerization inhibitor (0.1% by weight based on the photopolymerizable material) is also useful.

In the photopolymerizable layers of the elements of this invention, there can be used practically any initiator of addition polymerization that is capable of initiating polymerization under the influence of actinic radiation. The preferred photoinitiators are not significantly activatable thermally at temperatures below 85° C. They should be dispersible in the photopolymerizable compositions to the extent necessary for initiating the desired polymerization under the influence of the amount of radiant energy absorbed in relatively short-term exposures.

A preferred class of addition polymerization initiators activatable by actinic light and thermally inactive at and below 185° C. is a substituted or unsubstituted polynuclear quinone, which is a compound having two intracyclic carbonyl groups attached to intracyclic carbon atoms in a conjugated six-member carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz [a]-anthracene-7,12-dione.

Useful initiators thermally inactive at and below 85° C. include vicinal ketaldonyl compounds, e.g., diacetyl, benzil, etc.; α-ketaldonyl alcohols, e.g., benzoin, pivaloin, etc.; acyloin ethers, e.g., benzoin methyl or ethyl ethers; azonitriles, e.g., 1,1′-azadicyclohexane carbonitrile; α-hydrocarbon-substituted aromatic acyloins including α-methylbenzoin, α-allylbenzoin, etc. (U.S. Patent 2,722,512); O-alkyl xanthate esters of the type described in U.S. Patent 2,716,633.

Suitable thermal polymerization inhibitors that can be used in addition to the preferred p-methoxyphenol include hydroquinone and alkyl and aryl-substituted hydroquinones, tert-butyl catechol, pyrogallol, copper resinate, naphthylamines, beta-naphthol, cuprous chloride, 2,6-di-tert-butyl-p-cresol, phenothiozine, pyridine, nitrobenzene and dinitrobenzene. Other useful inhibitors include p-toluquinone and chloranil, and thiazine dyes, e.g., Thionine Blue G (C.I. 52025), Methylene Blue B (C.I. 52015) and Toluidine Blue O (C.I. 52040).

While the bases of support for the photopolymerizable elements of this invention are preferably flexible and composed of metal, e.g., aluminum or steel, they can be rigid. The supports can be made of various film-forming resins or polymers. Suitable transparent or translucent supports of these types are disclosed in U.S. Patent 2,760,863, column 5, lines 14–75 and column 6, lines 1–15.

The various elements made according to the following examples were tested as to the amount of exposure required to completely polymerize the adhesive layer, but not to initiate polymerization in the image layer. Similar tests can be made utilizing other elements not exemplified. For this purpose, small pieces (2 inches by 2 inches) of the photopolymerizable element (60 mils in thickness with a three-mil adhesive layer) were exposed in air for different lengths of time, i.e., ½ min., 1 min., 2 min., 4 min., etc., to the light of a 140 amp. carbon arc with reflector, at a distance of 30 inches from the arc. A Corning 1–57 filter was placed between the arc and the elements. This filter does not transmit any radiation below 340 mμ and very little above 750 mμ. The photopolymerizable element was kept at a temperature of about 20° C. during the exposure; it was mounted on a water-cooled aluminum plate.

After exposure each plate was tested for adhesion of the image layer to the adhesive layer by inserting a spatula between the two layers. If the adhesive layer was not completely polymerized, the spatula could be inserted easily and the image layer was readily separated. In an element wherein the adhesive was properly polymerized the spatula could only be inserted with considerable force, and the two layers could not be separated. In a further test the element was submitted to a spray wash with a suitable solvent solution for the polymeric binder to remove all unpolymerized monomer. In a correctly polymerized element the full thickness of the image layer could be removed but not the adhesive layer. The correct exposure to polymerize the adhesive was therefore made when the above tests indicated good adhesion with complete washout of the unexposed photopolymerizable layer. It is understood that while the conditions of the exposure test can vary, the procedure and results should be the same. For example, a different source of actinic radiation can be used, the distance of the element to the source can be varied, different filters can be used in place of the Corning 1–57, etc. In each instance the time for the complete polymerization of the adhesive layer without polymerization commencing in the photopolymerizable layer would have to be determined.

The invention will be further illustrated by but is not intended to be limited to the following examples wherein the parts and percentages are by weight unles otherwise indicated.

*Example I*

An adhesive compositon solution was composed of 37% solids in methylethyl ketone, the solids consisting of 79 grams of a copolyester prepared from a reaction mixture of an excess of ethylene glycol and dimethyl hexahydroterephthalate, dimethyl sebacate and dimethyl terephthalate in a molar ratio of the latter three reactants 8:1:1, respectively; 21 grams of an ethylenically unsaturated additon polymerizable compound, triethylene glycol diacrylate, containing 0.1% of a polymerization inhibitor p-methoxyphenol; and 0.5 grams of phenanthrenequinone as a photoinitiator.

A photopolymerizable element was prepared utilizing the adhesive composition of this example by coating it to a wet thickness of 15 mils on an aluminum sheet support 15 mils thick that had been "alodized." The process by which the aluminum sheet was "alodized" employs proprietary compositions sold by the American Chemical Paint Company, Ambler, Pennsylvania, and involves a five-step operation consisting of cleaning the aluminum sheets with mild alkali at approximately 80° C. for 2 to 5 minutes, rinsing in clear, cold water for 10 to 15 seconds and coating the sheet with an amorphous mixture of mixed metallic oxides and chromates from 0.05 to 0.01 mil thick, weighing 35 to 80 milligrams per square foot at approximately 20° to 40° C., in a stainless steel lined tank for 2 to 5 minutes. The coated sheet is rinsed with clear, cold water for 15 to 30 seconds, and given a final acidulated rinse with a dilute solution of the coating substance for 15 to 30 seconds at approximately 50° to 70° C. The adhesive composition was dried for 60 minutes by exposure to air at room temperature, resulting in an adhesive layer about 3.5 mils thick on the aluminum sheet support. A photopolymerizable layer or sheet was prepared from a mixture of 680 grams of cellulose acetate hydrogen succinate, 320 grams of triethylene glycol diacrylate containing 0.32 gram of anthraquinone as a photoinitiator and 0.32 gram of p-methoxyphenol as a thermal polymerization inhibitor. The mixture was placed on a rubber mill at 110° C., and after about 3 minutes of milling, the material "banded," i.e., it formed a continuous sheet around one roll of the rubber mill. After an additional 10 minutes of milling, the material was removed from the rubber mill and formed into a sheet 60 mils thick by pressing at 140° C. under a pressure of 300 pounds per square inch. The photopolymerizable sheet was then combined at room temperature with the adhesive covered support by means of combining rollers, i.e., a pair of rubber rolls exerting a force of approximately 1000 lb./in. across the rolls.

A 2-inch by 6-inch portion of the element was uniformly exposed for one minute in a 140 amp. carbon arc lamp fitted with a reflector and a Corning 1–57 filter, the element being positioned 30 inches from the arc. The element was maintained at a temperature of 20° C. by mounting on a water-cooled aluminum plate. A test had shown that this exposure is sufficient to completely cure the adhesive layer, but that it takes two minutes exposure before polymerization of the image layer commences.

The photopolymerizable element was placed in a vacuum frame, a letter type process negative being placed on the photopolymerizable layer, and the system was exposed to the unfiltered radiation of an 1800-watt high pressure mercury arc lamp. The exposure was such that each square inch of plate area received 1.75 watts of actinic radiation for 14 seconds. After removal from the vacuum frame, the element was submitted to a 9-minute spray-wash with 0.04 N aqueous NaOH. The resulting relief image was of excellent quality. In what corresponded to the unexposed areas there was a thin, continuous layer of polymerized adhesive. Prints made from this plate were of very good quality and the plate exhibited a long press life.

*Example II*

Example I was repeated, except that the phenanthrenequinone photoinitiator of the adhesive layer was replaced by the same amount of ethylanthraquinone. A one-minute filtered exposure was sufficient to polymerize the adhesive, whereas two minutes were required to start polymerization of the image layer. The resultant element was exposed imagewise in a vacuum frame to a photographic line negative and the unexposed areas were removed as described in Example I. The relief image obtained showed excellent adhesion to the support. High quality prints were obtained from this plate without damage to single characters.

*Example III*

A printing element similar to the one described in Example I was prepared, except that the phenanthrenequinone in the adhesive layer was replaced by the same amount of anthraquinone. This element required 1.5 minutes of filtered exposure to cure the adhesive layer. All other characteristics were the same as those of the element of Example I.

*Example IV*

Example I was repeated, 2.0 grams of uranyl nitrate being used instead of the 0.5 gram of phenanthrenequinone. A 1.5 minute exposure with the filtered radiation was sufficient to cure the adhesive.

*Example V*

Example I was repeated, except that the photopolymerizable image layer was prepared according to Example IV of Munger, U.S. Patent 2,923,673. The results obtained were comparable to those of Example I. This element was exposed in a vacuum frame to the unfiltered radiation of an 1800-watt high pressure mercury arc through a combination line and halftone negative so that each square inch received 1.75 watts of actinic radiation for 14 seconds. After spray-washing with 0.04 N sodium hydroxide solution for 9 minutes, a high quality printing plate was obtained that showed excellent image quality and a long press life.

*Example VI*

Example I was repeated, except that the anthraquinone photoinitiator (0.32 gram) in the image layer was replaced by the same amount of benzoin methyl ether. This plate required one minute of filtered carbon arc exposure to polymerize the adhesive, whereas 6 minutes of exposure were required before the image layer showed signs of polymerization. An imagewise exposure in a vacuum frame to the unfiltered light of a high pressure mercury arc through a photographic letter type process negative, followed by a wash-out with 0.04 N aqueous NaOH, as described in Example V, gave a relief printing plate of high quality. The adhesion, even of single characters, to the base support was excellent.

*Example VII*

Example VI was repeated, except that the triethylene glycol diacrylate monomeric compound of the image layer was replaced by an equal amount of polyethylene glycol diacrylate obtained from a polyethylene glycol of an average molecular weight of 300. The adhesive was polymerized and the relief printing plate prepared as described in Example VI, a printing plate of comparable quality being prepared.

*Example VIII*

Example VI was repeated, except that the phenanthrenequinone photoinitiator in the adhesive layer was replaced by an equal amount of anthraquinone. A three-minute exposure with the filtered carbon arc light as described in Example I was sufficient to photopolymerize the adhesive whereas a six-minute exposure was required to start polymerization of the image layer. The photopolymerizable element prepared was exposed imagewise through a letter type process negative to the radiation of a high pressure mercury arc and spray-washed with 0.04 N aqueous NaOH as described in Example V. The resulting relief printing plate was of good quality. The adhesion of the image layer, even of small, single characters, to the support was excellent. This plate gave high quality prints on a commercial printing press and showed a long press life.

*Example IX*

Example VI was repeated, except that the phenanthrenequinone photoinitiator of the adhesive layer was replaced by the same amount of ethylanthraquinone. Under the conditions described in Example I, the adhesive layer was polymerized in one minute. A six-minute exposure was required to start polymerization of the image layer.

*Example X*

Example VI was repeated, but 2% of uranyl nitrate photoinitiator were used in the adhesive layer in place of the 0.5% of phenanthrenequinone. With the filtered light source described in Example I complete curing of the adhesive layer was achieved in one minute. A six-minute exposure was required to polymerize the image layer.

Printing plates made from the photopolymerizable elements described in Examples IX and X showed good anchorage between polymer layer and support and suffered no damage when used under normal use conditions on a rotary printing press.

*Example XI*

Example I was repeated, except that the anthraquinone photoinitiator of the image layer was replaced by the same amount of benzophenone. Photopolymerization of the adhesive layer, as described above, required a one-minute exposure. Polymerization of the image layer required more than six minutes under these conditions.

*Example XII*

Example XI was repeated, but the phenanthrenequinone photoinitiator of the adhesive layer was replaced by the same amount of anthraquinone. This adhesive layer required a one-minute exposure to complete curing, whereas more than six minutes were required to start polymerization of the image layer.

*Example XIII*

Example XI was repeated, but the phenanthrenequinone photoinitiator of the adhesive layer was replaced by the same amount of ethylanthraquinone. Curing of the adhesive layer was completed in one minute; polymerization of the image layer required more than six minutes under the conditions described above.

*Example XIV*

Example XI was repeated, except that 2% uranyl nitrate photoinitiator was used in the adhesive layer instead of 0.5% of phenanthrenequinone. Under the conditions of Example I this adhesive layer was polymerized in one minute, whereas more than six minutes were required to show evidence of polymerization in the image layer.

The elements of the above Examples XI to XIV were exposed imagewise through a letter type process negative and treated as described in Example I. The resulting printing plates were of good quality and showed excellent adhesion to the support.

*Example XV*

A photopolymerizable adhesive composition of the type described in Example I was applied to a 25-mil thick steel plate which had been "bonderized," a six step operation described as follows:

(1) Clean the steel sheet with a mild alkali solution containing less than 0.1% alkali;

(2) Rinse twice in clear, cold water for a few seconds;

(3) "Bonderize" the sheet by spraying for 1 minute with a solution of free phosphoric acid, metallic acid phosphates and an oxidizing agent. The solution is maintained at a temperature of approximately 130° C.;

(4) Rinse with clear, cold water for a few seconds;

(5) Rinse with acidified water for a few seconds; and (6) Dry in an oven at over 100° C.

In the "bonderizing" process, the steel sheet product is thus coated with a mixed metallic phosphate coating weighing 13.2 milligrams per square foot. The process is described in an article by V. M. Darsey, Ind. Eng. Chem,. vol. 27, pages 1142–1144 (1935) and is a process of the Parker Rust Proof Company, Detroit, Michigan. The dry adhesive layer had a thickness of 3 mils. A photopolymerizable sheet was prepared from a filtered solution of 30 grams of N-methoxymethyl polyhexamethylene adipamide prepared as described in Example III of Saner and Burg U.S. Patent 2,972,540, and 30 grams of glycerol dimethacrylate in 160 milliliters of hot ethanol. Benzoin methyl ether in an amount of 0.05 gram was added to the solution. The solution was cast on a glass plate provided with a narrow dam near its periphery to prevent the solution from running over the edges of the plate and was allowed to evaporate in the dark for two days. The resulting clear, tough, flexible film 20 mils thick was cut to size of the aluminum sheet support and was laid on the adhesive covered support to form a sandwich. The sandwich was passed between combining rollers that exerted a total force of 1000 pounds across the rolls. The element was then exposed for one minute to the filtered carbon arc light described in Example I in order to polymerize the adhesive layer. A test had shown that this exposure resulted in complete curing of the adhesive layer, whereas an exposure of more than 6 minutes was required to start polymerization of the image layer. The photopolymerizable element thus prepared was exposed under an 1800-watt high pressure mercury arc lamp to 1.75 watts of actinic radiation per square inch for 14 seconds so that a middle square area 2 inches by 2 inches remained unexposed. The unexposed polymer was removed by spray-washing for 9 minutes with 0.04 N aqueous NaOH. The photopolymerized material in the exposed areas was unaffected by the wash-out solution. The resultant element thus consisted of a thick image layer at each end and a thin anchor layer of polymerized material in the middle where the unpolymerized material had been washed away. The element was severely flexed at the junction of one of the photopolymerized image areas and the washed out exposed area to determine whether the base support metal could be peeled from the back of the polymerized material. Good adhesion was obtained with no lifting of the photopolymerized material from the metal base support.

*Example XVI*

A photopolymerizable sheet or layer was cast on a glass plate from a solution of 75 grams of polyvinyl alcohol/acetate/hydrogen maleate (molar ratio 27/42/31), prepared by the method described in Example IV of Martin, U.S. Patent 2,902,365, 25 grams of 1,2-bis(3-methacrylamidopropoxy) ethane, and 0.05 gram of benzophenone in a mixture of 170 grams of ethanol and 35 ml. of water. The solvents were evaporated at room temperature under subdued light and the resulting 20-mil thick film was cut to the size of 2 inches by 6 inches. A similarly sized steel plate, 25 mils thick, and "bonderized" as described in Example XV was coated with an adhesive layer similar to the one described in Example III, except that the triethylene glycol diacrylate was replaced by the same amount of polyethylene glycol diacrylate prepared from a polyethylene glycol of an average molecular weight of 600. The photopolymerizable layer was placed over the adhesive coated steel plate and the assembly passed between combining rollers as described in Example 1. A one-minute exposure to the filtered carbon arc described in Example I completely polymerized the adhesive. A test showed that about 3 minutes exposure were required to start polymerization of the image layer. The element was then exposed in a vacuum frame to the unfiltered radiation of a high pressure mercury arc through a combination line and halftone negative, then brushed with a 1:1 by volume ethanol-water solution for 5 minutes. The unexposed areas of the element were washed out by this process, leaving a relief printing plate that showed excellent adhesion to the support. Repeated flexing of the plate did not result in any separation of the support and the polymer layer. This printing plate was used on a rotary printing press and gave prints of excellent quality.

*Example XVII*

Example I was repeated except that the copolyester component of the adhesive composition was replaced by a copolyester prepared by the reaction of ethylene glycol, dimethyl terephthalate (50 mole percent) and dimethyl sebacate (50 mole percent), with similarly satisfactory results.

*Example XVIII*

Example I was repeated except that the copolyester component of the adhesive composition was replaced by a mixture in equal parts by weight of two copolyesters, the first prepared by the reaction of ethylene glycol (excess) dimethyl terephthalate (33 mole percent) dimethyl isophthalate (17 mole percent) and dimethyl sebacate (50 mole percent) and the second prepared by the reaction of ethylene glycol (excess) dimethyl terephthalate (25 mole percent) dimethyl isophthalate (25 mole percent) dimethyl sebacate (25 mole percent) and dimethyl adipate (25 mole percent) with similarly satisfactory results.

*Example XIX*

A photopolymerizable element was prepared as described in Example I, but the phenanthrenequinone in the adhesive layer was replaced by 0.02 gram of anthraquinone (0.1% by weight based on the weight of ethylenically unsaturated compound) and the amount of inhibitor in the photopolymerizable image layer was increased to 1.12 grams (0.35% by weight based on the weight of ethylenically unsaturated compound). After photocuring the adhesive for 1½ minutes using the light source described in Example I, an imagewise exposure was administered to the photopolymerizable element as described in Example I. After washout of the unexposed areas with 0.04 N aqueous NaOH, a high quality printing relief was obtained.

Similar results can be obtained by substituting for the materials of the above examples equivalent amounts of the other materials and compositions disclosed in this application.

The photocurable adhesives of this invention are especially useful in manufacturing photopolymerizable printing plates in a continuous rather than a batchwise operation. For example, a continuous strip or web of supporting material of the types disclosed above passes through a first station where it is coated with the photopolymerizable adhesive and is dried. It then proceeds to a second station where the photopolymerizable material is applied in the desired thickness by any suitable means, e.g., by casting, extrusion or calendering, etc. In the case of extrusion the web should then pass between two combining rollers which press the photopolymerizable image layer firmly onto the adhesive coated support. When calendering is utilized, no separate combining rollers are required, the calendering rolls usually exert enough pressure to assure good surface contact between the support and the image layer. The assembly then moves to a third station where it is exposed to suitably filtered radiation in a manner that the adhesive layer undergoes complete polymerization but no polymerization commences in the image layer. The spectral composition and intensity of the curing radiation can easily be adjusted to compensate for various factors such as type and amount of photoinitiator in the adhesive layer, thickness of polymerizable image layer, web speed and other variables as indicated above.

In an alternate method of continuous production the image-forming photopolymerizable material is cast, extruded or calendered into a continuous web which can be unsupported or carried by a temporary support. This web is then coated with the adhesive solution and dried. A suitable permanent support is then applied to the web and pressed down with combining rollers. Finally, the adhesive layer of the element is polymerized as described above.

This continuous process represents a great advantage over the older processes. Although it is theoretically possible to undertake a continuous production of photopolymerizable materials, using, e.g., a thermally polymerizable adhesive layer, such a process requires very accurate heat control and extremely delicate timing of the thermal curing step, both of which are not as easily attained as are the intensity and spectral composition of the radiation source in the present process.

The photopolymerizable structures of the present invention are particularly well suited for the production of printing reliefs after the manner disclosed in Plambeck U.S. Patent 2,760,863. The printing reliefs can be used in all classes of printing but are most applicable to those classes of printing wherein a distinct difference in height between printing and non-printing areas is required. They are also useful in elements for thermal transfer processes as described in assignee's Burg and Cohen applications Serial No. 850,522, filed November 3, 1959, now U.S. Patent 3,060,025; Serial No. 839,304, filed September 11, 1959, now U.S. Patent 3,060,024 and Serial No. 831,700, filed August 5, 1959, now U.S. Patent 3,060,023. They are further useful for affixing phosphors to surfaces to provide color television screen and for forming printed circuit diagrams.

The particularly outstanding advantage of the elements of this invention lies in the inter-layer adhesion or bonding of superior strength attained by the use of the polyester or copolyester adhesive containing a monomer similar or identical to that of the image layer rather than adhesives used in prior art photopolymerizable elements. In addition, the photopolymerizable element made by the process of this invention provides a more serviceable article, in that it has improved support for relief images due to the polymerized layer forming a continuous support for the relief image. The element is also advantageous because the adhesive retains its elasticity over a wide temperature range. Still other advantages will be apparent from the foregoing description.

What is claimed is:

1. In a process for preparing a photopolymerizable element comprising a support (I), a solid photopolymerizable stratum (II) comprising a preformed compatible macromolecular polymer binding agent, a non-gaseous, addition-polymerizable ethylenically unsaturated compound containing at least one terminal ethylenic group, having a molecular weight of less than 1500, a boiling point above 100° C. at normal atmospheric pressure and being capable of forming a high polymer by free-radical initiated, chain-propagating addition polymerization in the presence of an addition polymerization initiator therefor activatable by actinic radiation and from 0.001 to 10 percent, by weight of the stratum, of such an initiator, said initiator being thermally inactive at 85° C. and below, and between the support (I) and the photopolymerizable stratum II and in surface contact with at least the latter, a layer (III) of an adhesive composition comprising (A) at least 66.5 parts by weight of a macromolecular linear polyester composition selected from the group consisting of (1) a polyester prepared by reacting (*a*) a compound taken from the group consisting of hexahydroterephthalic acid and an ester-forming derivative of hexahydroterephthalic acid and (*b*) a glycol having from 2 to 10 carbon atoms and 0 to 4 oxygen atoms in addition to the hydroxyl groups; (2) at least one copolyester prepared by reacting (*a*) at least one saturated aliphatic compound taken from the group consisting of adipic, pimelic, suberic, azelaic and sebacic acids and an ester-forming derivative of said acids, the total of the said compounds being in an amount of 50 mole percent of said copolyester, (*b*) at least one aromatic compound taken from the group consisting of terephthalic acid, isophthalic acid and an ester-forming derivative of said acids, the total of the said compounds being in an amount of 50 mole percent of said copolyester and (*c*) a glycol having from 2 to 10 carbon atoms and 0 to 4 oxygen atoms in addition to the hydroxyl groups; and (3) a copolyester prepared by reacting (*a*) a compound taken from the group consisting of hexahydroterephthalic acid and an ester-forming derivative of said acid in an amount up to 100 mole percent of the copolyester, (*b*) a saturated aliphatic compound taken from the group consisting of adipic, pimelic, suberic, azelaic and sebacic acids and an ester-forming derivative of said acids, in an amount up to 50 mole percent of the copolyester, (*c*) an aromatic compound taken from the group consisting of terephthalic, isophthalic acids and an ester-forming derivative of said acids, in an amount up to 50 mole percent of the copolyester and (*d*) a glycol having from 2 to 10 carbon atoms and 0 to 4 oxygen atoms in addition to the hydroxyl groups; (B) up to 33.5 parts by weight of an ethylenically unsaturated addition polymerizable compound, (C) 0 to 0.67 part by weight of a thermal polymerization inhibitor; and (D) from 0.5 to 5.0 parts by weight of an addition polymerization photoinitiator essentially thermally inactive below about 80° C. and activatable by actinic radiation, the improvement characterized by uniformly exposing said element, including said adhesive layer to actinic radiation in an amount sufficient to photopolymerize the adhesive but in an amount insufficient to initiate photopolymerization in said photopolymerizable layer the amount, reactivity and radiation sensitivity of said photoinitiator (D) being such that the most sensitive region of stratum (II) exhibits an induction period of at least 10 percent greater than the induction period in the least sensitive region of adhesive layer (III).

2. A process as defined in claim 1 wherein the addition polyemerization photoinitiator in said adhesive layer is phenanthrenequinone.

3. A process as defined in claim 1 wherein the addition polymerization photoinitiator in said adhesive layer is uranyl nitrate.

4. A process as defined in claim 1 wherein the addition polymerization photoinitiator in said adhesive layer is ethylanthraquinone.

5. A process as defined in claim 1 wherein said adhesive layer contains a polyester prepared by reacting dimethyl hexahydroterephthalate, dimethyl sebacate and dimethyl terephthalate and ethylene glycol.

6. A process as defined in claim 5 wherein said esters are present in a molar ratio of 8:1:1, respectively.

7. A process as defined in claim 1 wherein said adhesive composition comprises 75 to 80 parts by weight of said linear polymeric composition, 15 to 24.5 parts by weight of said ethylenically unsaturated compound, 0.1 to 1.0 part by weight of said inhibitor and 0.05 to 5.0 parts of said photoinitiator.

8. A process as defined in claim 1 wherein said support is transparent to said actinic radiation and said adhesive is photopolymerized by exposing through said support.

9. A process for preparing a photopolymerizable element which comprises applying to a base support an adhesive composition as defined in claim 1, laminating a solid photopolymerizable stratum comprising a preformed compatible macromolecular polymer binding agent, a non-gaseous, addition-polymerizable ethylenically unsaturated compound containing at least one terminal ethylenic group, having a molecular weight of less than 1500, a boiling point above 100° C. at normal atmospheric pressure and being capable of forming a high polymer by free-radical initiated, chain-propagating addition polymerization in the presence of an addition polymerization initiator therefor activatable by actinic radiation, and from 0.001 to 10 percent by weight of the stratum, of such an initiator, said initiator being thermally inactive at 85° C. and below, to the adhesive-bearing support by pressing at a temperature below the thermal activity temperature of the initiator in said adhesive layer, and uniformly exposing said element, including said adhesive layer to actinic radiation in an amount sufficient to photopolymerize, the adhesive but in an amount insufficient to initiate photopolymerization in said photopolymerizable layer, the said initiator in the adhesive layer having an absorption per unit layer thickness in the actinic radation exposure range at least 1.5 times as great as the initiator in the photopolymerizable layer.

10. A process as defined in claim 1 wherein said adhesive composition is applied to said photopolymerizable layer prior to lamination to the base support.

11. A photopolymerizable element comprising a support (I); a solid photopolymerizable stratum (II) comprising a preformed, compatible macromolecular polymer binding agent, a non-gaseous, addition-polymerizable ethylenically unsaturated compound containing at least one terminal ethylenic group, having a molecular weight of less than 1500, a boiling point above 100° C. at normal atomspheric pressure and being capable of forming a high polymer by free-radical initiated, chain-propagating addition polymerization in the presence of an addition polymerization initiator therefor activatable by actinic radiation, and from 0.001 to 10 percent, by weight of the stratum, of such an initiator, said initiator being thermally inactive at 85° C. and below, and between the support (I) and the photopolymerizable stratum II and in surface contact with at least the latter, a layer (III) of an adhesive composition comprising (A) at least 66.5 parts by weight of macromolecular linear polyester composition selected from the group consisting of: (1) a polyester prepared by (*a*) a compound taken from the group consisting of hexahydroterephthalic acid and an ester-forming derivative of hexahydroterephthalic acid and (*b*) a glycol having from 2 to 10 carbon atoms and 0 to 4 oxygen atoms in addition to the hydroxyl groups; (2) at least one copolyester prepared by reacting (*a*) at least one saturated aliphatic compound taken from the group consisting of adipic, pimelic, suberic, azelaic and sebacic acids and an ester-forming derivative of said acids, the total of the said compounds being in an amount of 50 mole percent of said copolyester, (*b*) at least one aromatic compound taken from the group consisting of terephthalic acid, isophthalic acid and an ester-forming derivative of said acids, the total of the said compounds being in an amount of 50 mole percent of said copolyester and (*c*) a glycol having from 2 to 10 carbon atoms and 0 to 4 oxygen atoms in addition to the hydroxyl groups; and (3) a copolyester prepared by reacting (*a*) a compound taken from the group consisting of hexahydroterephthalic acid and an ester-forming derivative of said acid in an amount up to 100 mole percent of the copolyester, (*b*) a saturated aliphatic compound taken from the group consisting of adipic, pimelic, suberic, azelaic and sebacic acids and an ester-forming derivative of said acids, in an amount up to 50 mole percent of the copolyester, (*c*) an aromatic compound taken from the group consisting of terephthalic, isophthalic acids and an ester-forming derivative of said acids, in an amount up to 50 mole percent of the copolyester and (*d*) a glycol having from 2 to 10 carbon atoms and 0 to 4 oxygen atoms in addition to the hydroxyl groups; (B) up to 33.5 parts by weight of an ethylenically unsaturated addition polymerizable compound; (C) 0 to 0.67 part by weight of a thermal polymerization inhibitor; and (D) 0.5 to 5.0 parts by weight of an addition polymerization photoinitiator essentially thermally inactive below about 80° C. and activatable by actinic radiation the amount, reactivity and radiation sensitivity of said photoinitiator (D) being such that the most sensitive region of stratum (II) exhibits an induction period of at least 10 percent greater than the induction period in the least sensitive region of adhesive layer (III).

12. An element as defined in claim 11 wherein a stratum containing an antihalation material is disposed below the bottom surface of said adhesive layer.

13. An element as defined in claim 11 wherein said photopolymerizable stratum comprises 40 to 90 parts by weight of said polymer binding agent and 10 to 60 parts by weight of said ethylenically unsaturated compound.

14. A photopolymerizable element obtained by the process of claim 1.

References Cited by the Examiner

UNITED STATES PATENTS

| | | | |
|---|---|---|---|
| 2,791,504 | 5/1957 | Plambeck | 96—115 X |
| 2,964,401 | 12/1960 | Plambeck | 96—35 |
| 2,993,789 | 7/1961 | Crawford | 96—115 X |
| 3,036,913 | 5/1962 | Burg | 96—115 X |

FOREIGN PATENTS

| | | |
|---|---|---|
| 864,041 | 3/1961 | Great Britain. |

NORMAN G. TORCHIN, *Primary Examiner.*

HAROLD N. BURSTEIN, *Examiner.*